(12) United States Patent
Hosek

(10) Patent No.: US 9,401,296 B2
(45) Date of Patent: Jul. 26, 2016

(54) VACUUM ROBOT ADAPTED TO GRIP AND TRANSPORT A SUBSTRATE AND METHOD THEREOF WITH PASSIVE BIAS

(71) Applicant: Persimmon Technologies Corporation, Wakefield, MA (US)

(72) Inventor: Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 154 days.

(21) Appl. No.: 13/688,635

(22) Filed: Nov. 29, 2012

(65) Prior Publication Data

US 2013/0294877 A1    Nov. 7, 2013

Related U.S. Application Data

(60) Provisional application No. 61/629,830, filed on Nov. 29, 2011.

(51) Int. Cl.
*H01L 21/687*    (2006.01)
*H01L 21/683*    (2006.01)
*B25J 15/00*    (2006.01)
*B25J 15/08*    (2006.01)
*B25J 15/10*    (2006.01)

(52) U.S. Cl.
CPC .......... *H01L 21/683* (2013.01); *B25J 15/0014* (2013.01); *B25J 15/083* (2013.01); *B25J 15/10* (2013.01); *H01L 21/68707* (2013.01)

(58) Field of Classification Search
CPC .. B25J 15/0014; B25J 15/0038; B25J 15/083; B25J 15/086; B25J 15/10; B25J 15/106; H01L 21/6833; H01L 21/68707

USPC ..................... 414/744.8, 225.01, 941; 901/39
See application file for complete search history.

(56) References Cited

U.S. PATENT DOCUMENTS

| | | | |
|---|---|---|---|
| 4,715,637 A * | 12/1987 | Hosoda et al. ................ 414/941 |
| 4,715,921 A | 12/1987 | Maher et al. |
| 4,730,976 A | 3/1988 | Davis et al. |
| 5,180,276 A | 1/1993 | Hendrickson |
| 5,404,894 A | 4/1995 | Shiraiwa |
| 5,647,724 A | 7/1997 | Davis, Jr. et al. |
| 5,765,983 A | 6/1998 | Caveney et al. |
| 5,810,935 A * | 9/1998 | Lee et al. ...................... 414/941 |
| 5,882,413 A | 3/1999 | Beaulieu et al. |
| 5,951,770 A * | 9/1999 | Perlov et al. ................. 414/941 |

(Continued)

FOREIGN PATENT DOCUMENTS

JP    2010179420 A  *  8/2010

*Primary Examiner* — Gerald McClain
(74) *Attorney, Agent, or Firm* — Iandiorio Teska & Coleman, LLP

(57) ABSTRACT

A vacuum robot adapted to grip and transport a substrate. The robot includes a robot drive coupled to an arm and having an end-effector adapted to support the substrate. A robot gripper system includes a front support having at least one hard stop, a movable contact element coupled to the end-effector, a bias device and at least one actuator coupled to the end-effector configured to move the contact element between a release position and a grip position. The bias device is configured to passively bias the contact element in the grip position such that the contact element contacts an edge of the substrate to urge the substrate against the at least one hard stop to secure the substrate in the grip position and to passively bias the contact element in the release position such that the contact element is retained in the release position.

20 Claims, 12 Drawing Sheets

(56) References Cited

U.S. PATENT DOCUMENTS

| | | |
|---|---|---|
| 6,116,848 A | 9/2000 | Thomas et al. |
| 6,208,751 B1 | 3/2001 | Almogy |
| 6,256,555 B1 | 7/2001 | Bacchi et al. |
| 6,283,701 B1 | 9/2001 | Sundar et al. |
| 6,287,386 B1 * | 9/2001 | Perlov et al. ............... 414/941 |
| 6,322,119 B1 * | 11/2001 | Schmidt et al. ............ 414/744.8 |
| 6,363,808 B1 | 4/2002 | Wakabayashi et al. |
| 6,451,118 B1 | 9/2002 | Garriga |
| 6,485,250 B2 | 11/2002 | Hofmeister |
| 6,810,935 B2 | 11/2004 | Lemens et al. |
| 7,226,269 B2 * | 6/2007 | Sundar et al. ............... 414/941 |
| 7,245,989 B2 | 7/2007 | Hosek et al. |
| 7,374,393 B2 | 5/2008 | Rice et al. |
| 2006/0099063 A1 | 5/2006 | Pietrantonio et al. |
| 2006/0245856 A1 * | 11/2006 | Sundar et al. ............... 414/217 |
| 2012/0189406 A1 | 7/2012 | Duhamel et al. |
| 2015/0016935 A1 * | 1/2015 | Hashimoto et al. ....... 414/744.5 |

* cited by examiner

VACUUM ROBOT ADAPTED TO GRIP AND TRANSPORT A SUBSTRATE AND METHOD THEREOF WITH PASSIVE BIAS

RELATED APPLICATIONS

This application claims benefit of and priority to U.S. Provisional Application Ser. No. 61/629,830 Nov. 29, 2011 under 35 U.S.C. §§119, 120, 363, 365, and 37 C.F.R. §1.55 and §1.78 and incorporated herein by this reference.

FIELD OF THE INVENTION

The disclosed embodiment relates to a vacuum robot adapted to grip and transport a substrate and method thereof.

BACKGROUND OF THE INVENTION

Conventional manufacturing technologies for semiconductor integrated circuits may include processing of silicon wafers, often referred to as substrates, in fully automated vacuum cluster tools. See e.g., U.S. Pat. Nos. 5,882,413, 6,208,751, and 6,451,118, each incorporated by reference herein. A typical cluster tool may include a circular vacuum chamber with load locks and process modules connected radially to the circumference of the chamber in a star pattern. The tool is typically serviced by a vacuum environment robotic manipulator (robot) which is located near the center of the chamber and cycles the substrates from the load locks through the process modules and back to the load locks. Another robot may be located in an atmospheric transfer module which serves as an interface between the load locks of the vacuum chamber and standardized load ports serviced by an external transportation system.

A conventional vacuum environment robotic manipulator typically includes a drive unit which houses all active components of the robotic manipulator, e.g., actuators and sensors, and one or more arms driven by the drive unit. The arm(s) are typically passive mechanisms, i.e., they do not include any active components, such as actuators and sensors. This is primarily due to difficulties with out-gassing, power distribution and heat removal in vacuum environments.

Typical vacuum environment single-end-effector arm designs for a conventional cluster tool chamber include telescoping. See e.g., U.S. Pat. Nos. 4,715,921 and 5,404,894, SCARA-type, e.g., U.S. Pat. No. 5,765,983, and frog-leg mechanisms, e.g., U.S. Pat. No. 4,730,976, all of which are incorporated by reference herein. The drawbacks of a star configuration of a conventional cluster tool chamber may include a relatively large footprint and inconvenient interface geometry. In response to the growing demand for footprint reduction, tools with stations arranged in a non-radial manner have been introduced. In order to access non-radial (orthogonal) stations properly, the vacuum environment robotic manipulator needs to be capable of moving and positioning the end-effector to a given point with a specified orientation, i.e., providing three degrees of freedom in the plane of operation. An example concept of such a planar 3DOF robot arm was disclosed in U.S. Pat. No. 7,245,989, incorporated by reference herein.

In many applications, a vacuum environment robotic manipulator is required to replace a processed substrate with a fresh substrate. This operation, typically referred to as a substrate exchange, often directly affects the throughput performance of the cluster tool, i.e., the number of substrates processed by the tool per hour. In order to complete a substrate exchange operation, a single-end-effector robotic manipulator typically picks the processed substrate from the workstation, places it to a specified location, picks a fresh substrate from another location, and places it to the workstation. This sequence typically requires a total of thirteen discrete moves. The number of moves, and thus the substrate exchange time, may be improved substantially by utilizing a robot with two or more end-effectors. See e.g., U.S. Pat. Nos. 5,180,276, 5,647,724, 6,485,250, and U.S. Publ. No. 2006/0099063, all of which are incorporated by reference herein. In these examples, the robot picks the processed substrate by one end-effector and replaces it by a fresh substrate readily available on another end-effector, thus reducing substantially the number of moves on the critical path.

While atmospheric environment robots often utilize various substrate grippers, the arm(s) of the vacuum environment robotic manipulators are passive mechanisms and therefore typically hold the substrate subject to processing solely by the means of frictional forces between the substrate and the robot end-effector. Since the inertial force at the substrate cannot exceed the holding force securing the substrate to the end-effector in order to prevent undesirable slippage, the acceleration of the end-effector carrying a substrate needs to be limited, which in turn may limit the throughput performance (number of substrates processed per hour) of the vacuum environment robotic manipulators.

Therefore, it is advantageous to provide a vacuum-compatible robot gripper system, such as an active edge-clamping mechanism, that would eliminate the acceleration constraint due to substrate slippage and allowed for an increased throughput performance of the vacuum environment robots.

SUMMARY OF THE EMBODIMENTS AND METHODS

In one aspect, a vacuum robot adapted to grip and transport a substrate is featured. The robot includes a robot drive coupled to an arm and having an end-effector adapted to support the substrate. A robot gripper system coupled to the end-effector includes a front support having at least one hard stop, a movable contact element, a bias device movably coupled to the contact element, and at least one actuator coupled to the end-effector configured to move the contact element between a release position and a grip position. The bias device is configured to passively bias the contact element in the grip position such that the contact element contacts an edge of the substrate to urge the substrate against the at least one hard stop to secure the substrate in the grip position and configured to passively bias the contact element in the release position such that the contact element is retained in the release position.

In one embodiment, the gripper system may be configured to stop delivering power to the at least one actuator when the contact element is in the grip position. The gripper system may be configured to stop delivering power to the at least one actuator when the contact element is in the release position. The at least one actuator may be configured to measure the position of the contact element to determine a gripped substrate state. The at least on actuator may include one or more solenoids. The bias device may include one or more springs and/or one or more flexures. The at least one actuator may be configured to control the speed in which the contact element moves from the release position to the grip position and from the grip position to the release position. The gripper system may be configured to harvest motion from the articulated arm and includes a torsional spring configured to store harvested motion. The one or more flexures may be configured in an angled arrangement to asymmetrically bias the force profile of the flexures. The one or more flexures may include a flexure having a curved profile. The gripper system may be configured to maintain the substrate in the gripped substrate state when the arm accelerates or decelerates.

In another aspect, a robot adapted to transport a substrate is featured. The robot includes a robot drive coupled to an arm and having an end-effector adapted to support the substrate. A front support has at least one hard stop coupled to the end-effector. A contact element is movably coupled to the end-effector. A bias device is coupled to the contact element. At least one actuator is coupled to the end-effector and is configured to move the contact element between a grip position and a release position. The bias device is configured to passively bias the contact element in the grip position such that the contact element contacts an edge of the substrate urging the substrate against the at least one hard stop and is configured to passively bias the contact element in the release position such that the contact element is retained in the release position.

In another aspect, a method for a robot to transport a substrate is featured. The method includes providing a robot drive coupled to an arm and having an end-effector adapted to support the substrate, providing a front support having at least one hard stop coupled to the end-effector, moving a contact element between a grip position and a release position, passively biasing the contact element in the grip position such that the contact element contacts an edge of the substrate to urge the substrate against the at least one hard stop, and passively biasing the contact element in the release position such that the contact element is retained in the release position.

In one embodiment, the method may include stopping delivery of power to at least one actuator when the contact element is in the grip position. The method may further include stopping delivery of power to at least one actuator when the contact element is in the release position. The method may include measuring the position of the contact element to determine a gripped substrate state. The method may include controlling the speed in which the contact element moves from the release position to the grip position and from the grip position to the release position. The method may include harvesting motion from the arm. The method may include storing the harvested motion. The method may include maintaining the substrate in the gripped state when the arm accelerates or decelerates.

BRIEF DESCRIPTION OF THE SEVERAL VIEWS OF THE DRAWINGS

Other objects, features and advantages will occur to those skilled in the art from the following description of an embodiment and the accompanying drawings, in which.

DESCRIPTION OF THE INVENTION

Figure 1:
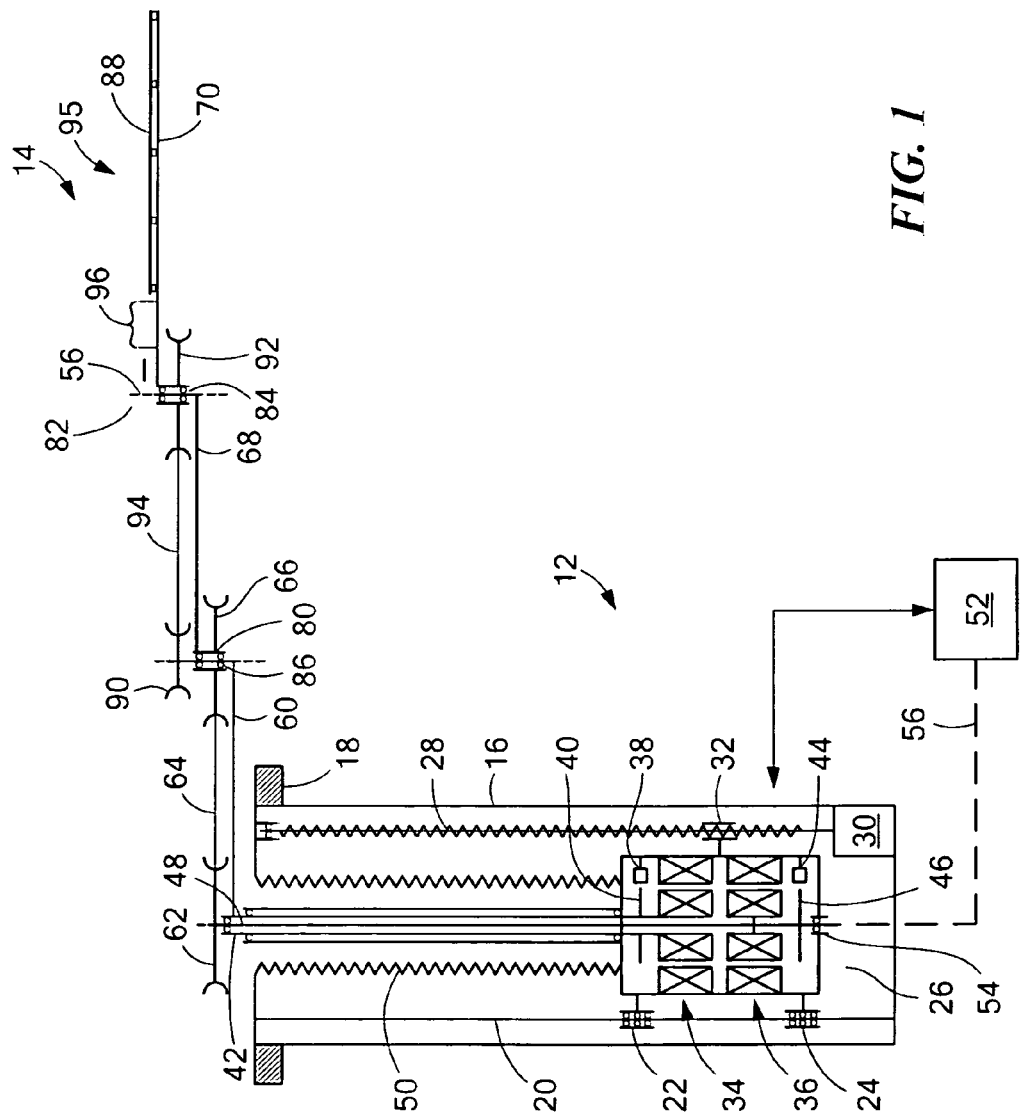
FIG. 1 is a schematic side-view of one embodiment of the robot adapted to transport a substrate.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In the example shown in FIG. 1, robot system 10 may include drive unit 12 which may enable a plurality of rotary motion axes and vertical lift motion axes and one or more arm assemblies, e.g., arm assembly 14 driven by the drive unit 12. Robot drive unit 12 and arm 14 may be any suitable actuation device, such as a rotary or linear stage or one or more axes or a robot drive as discussed with reference to FIG. 1 The arm may be any suitable device that couples the end-effector to the drive, such a linkage or platform, or articulated arm, having one or more linear and/or rotary axes, or as described with respect to FIG. 1. Drive unit chassis 16 may be suspended from mounting arrangement 18 where arrangement 18 may be a chamber, such as a vacuum chamber. Alternatively, the mounting arrangement may be on the side, at the bottom, or the drive unit may be mounted in any other suitable manner. drive 12 may include one or more vertical rails 20 with linear bearings 22, 24 to provide guidance to movable housing 26 vertically driven by screw 28 rotated by motor 30. Ball assembly 32 is fixed to housing 26 and is driven by screw 28. In this example, only one guide rail 20 is shown for simplicity. Motor 30, screw 28, and ball assembly 32 may form the Z-axis drive for housing 26.

Housing 26, itself, may incorporate two rotary motion axes. The first rotary motion axis of housing 26 may comprise motor 34 (e.g., a stator/rotor pair), and a position encoder, including, for example, encoder read-head 38 and encoder disk 40 for shaft 42. The second rotary motion axis incorporated into housing 26 may include another motor 36 and a position encoder, comprising, for example, encoder read-head 44 and encoder disk 46 for shaft 48.

In one aspect, bellows 50 may be used to accommodate motion of housing 26 along rail(s) 20 separating the environment where motor rotors and encoder disks operate, for example, in a vacuum from the outside environment, e.g., the atmosphere.

Motor 34 may drive hollow shaft 42 which may be connected to first link 60 of arm assembly 14. Similarly, motor 36 may be connected to coaxial inner shaft 48 which may be coupled (via a belt drive comprising, for example, pulley 62, belt 64 and pulley 66 to second link 68. Alternately, motor 36 and encoder read-head 44 and encoder disk 46 may be packaged in link 60 directly or indirectly driving link 68. Another arrangement may be employed to maintain radial orientation of end-effector 70 regardless of the position of links 60, 68. Here, this may be achieved due to a 1:2 ratio between shaft 80 having pulley 90 incorporated into first link 60 and wrist 82 having pulley 92 connected to end-effector 70 with wrist 82 rotatable on second link 68 by bearing 84 coupling wrist 82 to second link 68. Here, band 94 may couple pulley 90 to pulley 92 forming the 1:2 ratio. First link 60 and second link 68 may be coupled via bearings or rotary joint 86 and second link 68 and end-effector 70 may be coupled through rotary joint 84. End-effector 70 may carry payload 88, for example, a semiconductor substrate or other suitable substrate or payload. Vacuum-compatible robot gripper system 95 with active gripper mechanism 96 may be coupled to end-effector 70 to grip the edge of substrate 88 as will be discussed below. Controller 52 may control active gripper mechanism 96 with communication via wires 56 through feed through 54. Alternately, any suitable control or communication may be provided. Here, wires 56 may be routed as required with slip rings, service loops or otherwise from controller 52 and through drive 12 and arm 14.

Housing 26 may have an internal motor configuration (rotors internal to stators) and a radial position encoder configuration (encoder read-heads arranged radially with respect to encoder disks). Although motors and one arm are shown, more may be provided. In alternate aspects, the various motor and encoder arrangements used in housing 26 may employ external motor configurations. See, e.g., U.S. Pat. No. 6,363,808, incorporated by reference herein. In addition, as a feature of one or more embodiments of the robot system with independent arms, the motors in each housing, whether configured in an internal or external arrangement, may be located coaxially or in a parallel configuration in the same plane (as opposed to being stacked). The stators may be located in vacuum, and a separation wall between the stators and rotors may be used, magnetic couplers or feed through(s) may be employed or another sealing arrangement may be used.

In the example shown, two rotary motion axes, one vertical lift axes, and one arm are shown. However, in other examples, any number of rotary motion axes, vertical lift axes, and arms may be used.

Figure 2:
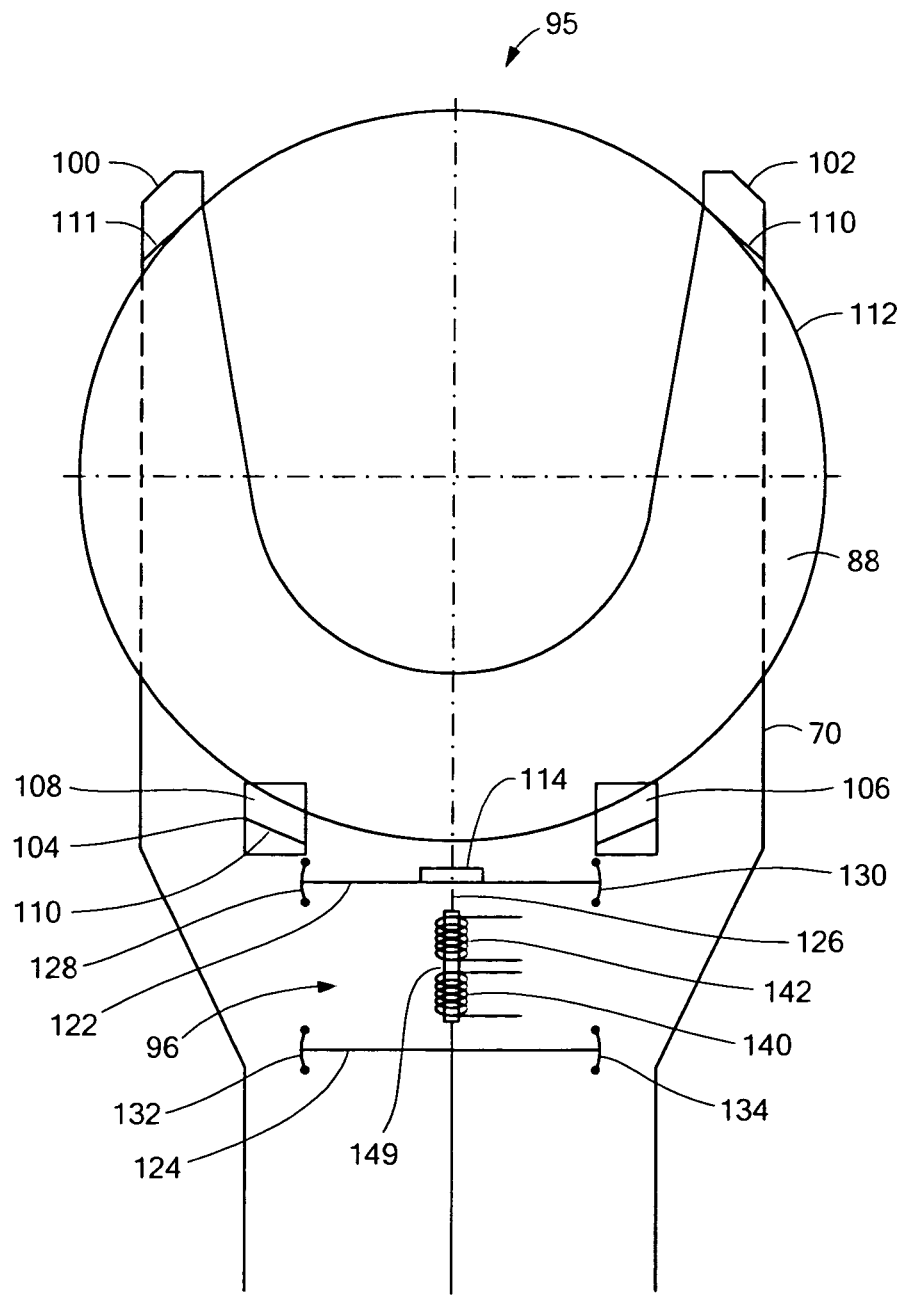
FIG. 2 is a schematic top-view showing in further detail the primary components of one embodiment of the vacuum-compatible robot gripper system shown in FIG. 1.

Exemplary embodiments of the vacuum-compatible robot gripper system 95 according to the present disclosed embodiment are discussed below. One exemplary embodiment of the vacuum-compatible robot gripper system according to the disclosed embodiment is shown in FIG. 2. In this example, robot gripper system as may include one or more passive front support pads 100, 102 and one or more rear support pads 104, 106 attached to robot end-effector 70 and configured to support substrate 88. Each front support pad 100, 102 and each rear support pad 104, 106 may include inclined portion 108 and hard-stop portion 110. Inclined portion 108 of support pads 100, 102, 104, 106 may be designed to limit contact between substrate 88 and support pads 100, 102, 104, 106 to an area close to outer edge 112 of substrate 88. Hard stop portions 110 of support pads 100, 102, 104, 106 may be configured to limit motion of substrate 88 so that edge 112 of substrate 88 may not move on inclined portions of support pads 100, 102, 104, 106 beyond hard stop portions 110 of support pads 100, 102, 104, 106.

Figure 3:
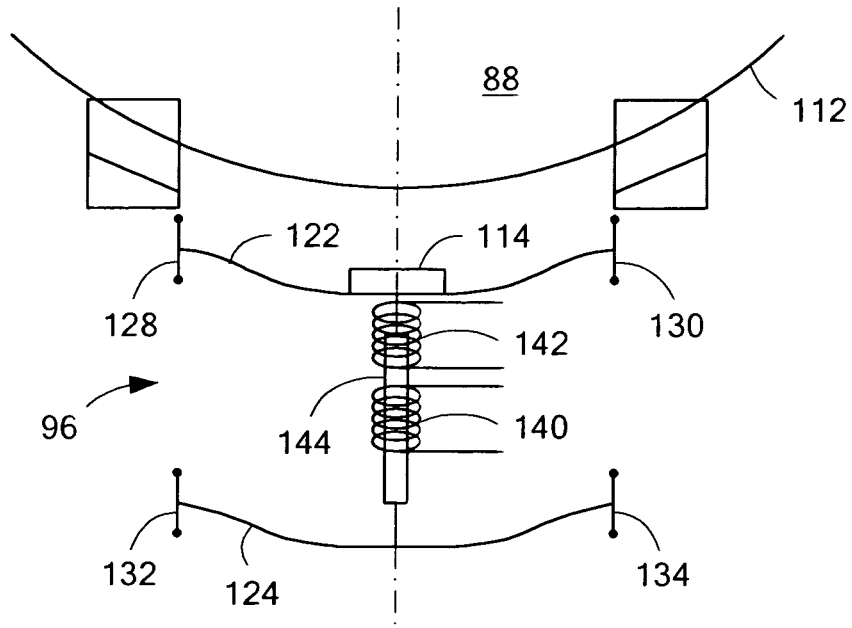
FIG. 3 is a schematic top-view showing one embodiment of the active gripper mechanism shown in FIG. 2 in the load/release position.
Figure 4:
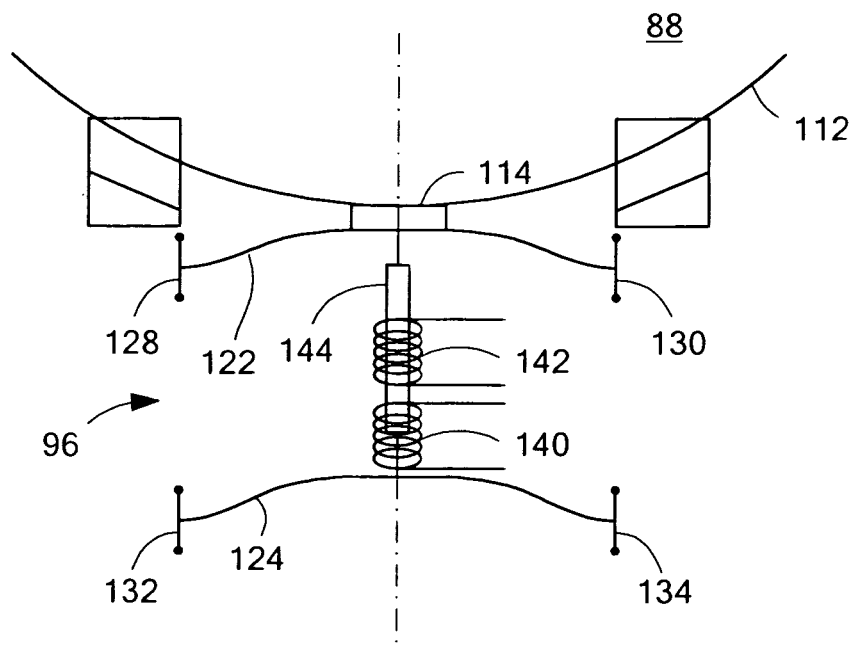
FIG. 4 is a schematic top-view showing one embodiment of the active gripper mechanism shown in FIG. 2 in the substrate gripping position.
Figure 5:
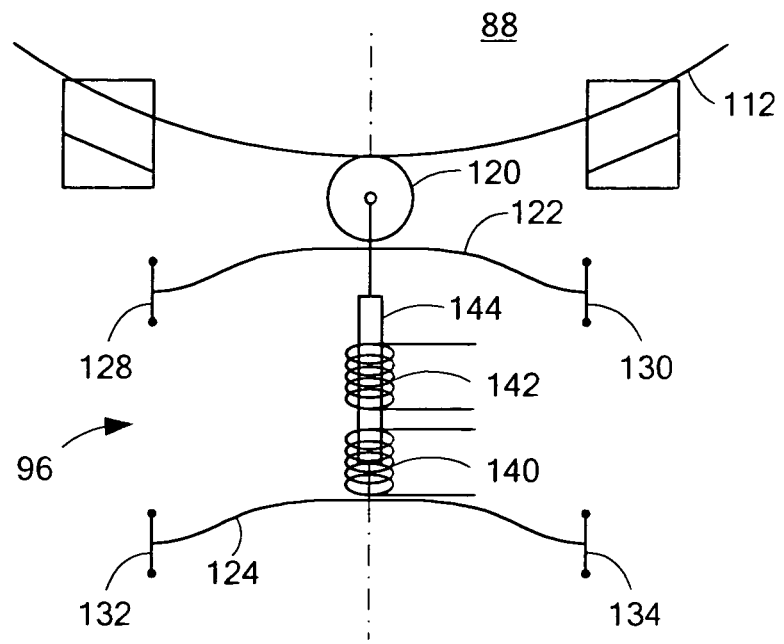
FIG. 5 is a schematic top-view of another embodiment of the active gripper mechanism shown in FIG. 2.

One exemplary embodiment of robot gripper system 95 shown in FIG. 1 may further include active gripper mechanism 96, FIG. 2, with contact element 114 configured to contact edge 112 of substrate 88. Contact element 114 may be moveable between a retracted substrate loading/release position, e.g., as shown in FIG. 3, and extended substrate gripping position, e.g., as shown in FIG. 4, in which it exerts force on substrate 88 to clamp substrate 88, FIG. 2, against hard stop portions 110 of front support pads 102, 104. In the example shown in FIG. 2, contact element 114 features a flat surface to contact edge 112 of substrate 88. However, contact element 114 may be of any form suitable to contact edge 112 of substrate 88 and may include an arrangement with one or more rollers 120, e.g., as shown in FIG. 5.

As shown in FIG. 2, contact element 114 may be coupled to a bias device, e.g., system of flexures 122 and 124, which may be connected through rod 126 and coupled to robot end-effector 70 via flexures 128, 130, 132, 134 respectively as shown. Here, flexures 122, 124, 128, 130, 132, 134 may be configured to suspend contact element 114 so that contact element 114 can move along a substantially straight line between the retracted substrate loading/release position, shown in FIG. 3, and the extended substrate gripping position, shown in FIG. 4, and provide an adequate passive force to keep contact element 114 in the retracted substrate loading/release position shown in FIG. 3 as well as to exert sufficient passive force to keep substrate 88 clamped against hard stop portions 110, FIG. 2, of front support pads 100, 102 in the extended substrate gripping position shown in FIG. 4 regardless of the effects of the acceleration of the robot arm.

Actuators 140 and 142, e.g., solenoids or similar type devices, FIGS. 2-4, may be utilized to exert force on iron core 144 coupled to rod 126 and move contact element 114 between the retracted substrate loading/release position shown in FIG. 3 and the extended substrate gripping position shown in FIG. 4. In particular, solenoid 142 may be energized to move contact element 114 from the retracted substrate loading/release position shown in FIG. 3 to the extended substrate gripping position shown in FIG. 4. Similarly, solenoid 140 may be energized to move contact element 114 from the extended substrate gripping position shown in FIG. 4 to the retracted substrate loading/release position shown in FIG. 3. When the desired state of the gripper system 95 has been achieved, e.g., in the gripping position shown in FIG. 4, power may be no longer delivered to FIG. 4, from solenoids 140, 142, and robot gripper system 95 may be maintained in the open state (contact element retracted in substrate loading/release position) or close state (contact element extended in substrate gripping position) solely by the passive forces produced by flexures 122, 124, 128, 130, 132, 134.

Actuators or solenoids 140 and 142 may be further utilized to sense (measure) position of contact element 114 and verify robot gripper system 95 is in the expected state. For example, after energizing solenoid 142 to extend contact element 114 to grip substrate 88, the measured position of contact element 114 may be compared with the minimum and maximum extension values that correspond to properly gripped substrate 88, preferably taking into account the tolerances of substrate 88. If the measured position of contact element 114 exceeds the maximum extension value that corresponds to properly gripped substrate 88, an error condition may be detected, for example, because no substrate was loaded onto robot end-effector 70 prior to energizing solenoid 142, substrate 88 was not loaded properly onto end-effector 70 and slipped over hard-stop portion 110 of one or both front support pads 100, 102, or substrate 88 was not loaded properly onto end-effector 70 and contact element 114 extended below or over substrate 88. Similarly, if the measured position of contact element 114 is less than the minimum extension value that corresponds to properly gripped substrate 88, another error condition may be detected, for example, because substrate 88 did not move into the expected gripped position against hard-stop portions 110 of front support pads 100, 102, a substrate of a larger size was loaded onto end-effector 70, or due to electrical or mechanical malfunction of gripper mechanism 96.

Similarly, after energizing actuator or solenoid 140 to retract contact element 114 to release or get ready for loading of substrate 88, the measured position of contact element 114 may be compared with the minimum extension value of contact element 114, preferably taking into account the tolerances of the components in the robot gripper system. If the measured position of contact element 114 is greater than the minimum extension value, yet another error condition may be detected, for example, due to electrical or mechanical malfunction of gripper mechanism 96.

The position of contact element 114 may be sensed by exciting one of the coils 140 or 142 by an alternating current and measuring the amplitude of the voltage induced in the other coil 142 or 140 due to the excitation current. The amplitude of the excitation current may be low and substantially negligible compared to the passive forces necessary to maintain the state of the robot gripper system.

Figure 6:
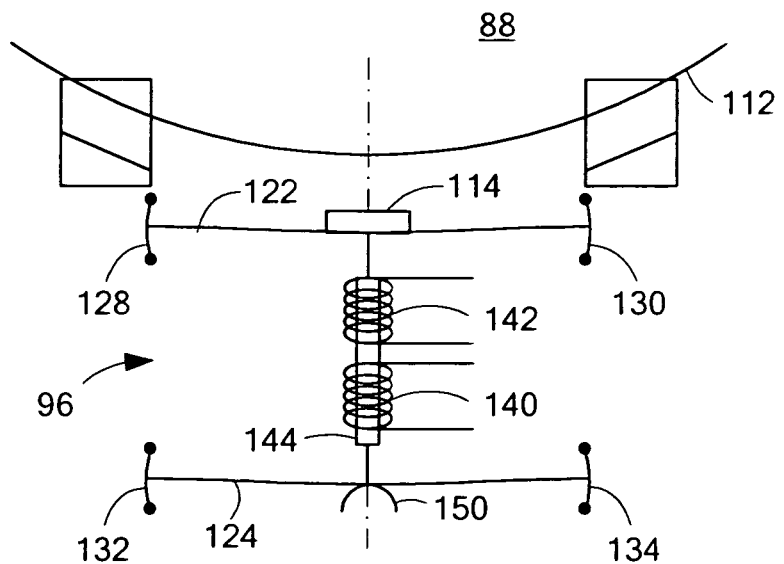
FIG. 6 is a schematic top-view of another embodiment of the active gripper mechanism shown in FIG. 2.
Figure 7:
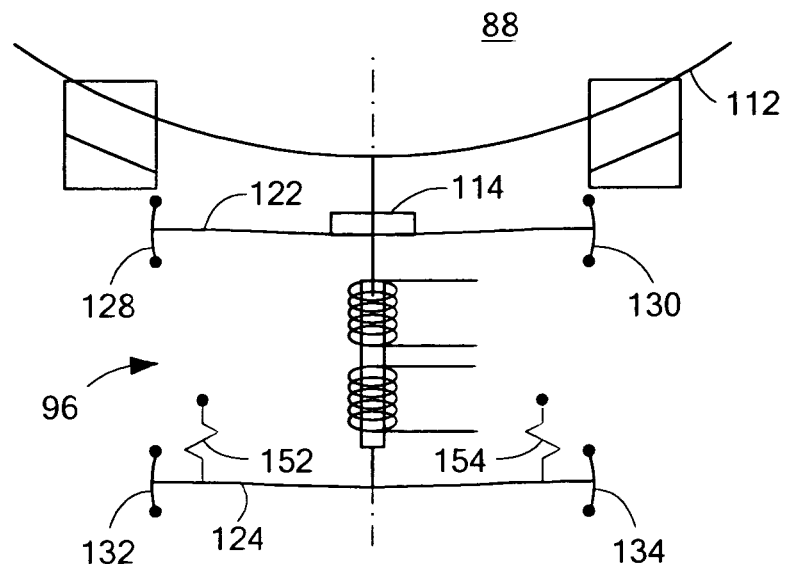
FIG. 7 is a schematic top-view of another embodiment of the active gripper mechanism shown in FIG. 2.

In order to reduce the energy and force necessary to move contact element 114 from the retracted substrate loading/release position to the extended substrate gripping position, an arrangement may be incorporated into active gripper mechanism 96 to limit the range of motion of contact element 114 so that contact element 114 may retract only to a predefined distance beyond the neutral point (unstable equilibrium) of the system of flexures 122, 124, 128, 130, 132, 134. For example, hard-stop 150, FIG. 6, or flexures 152, 154, FIG. 7, may be utilized for this purpose.

Figure 18:
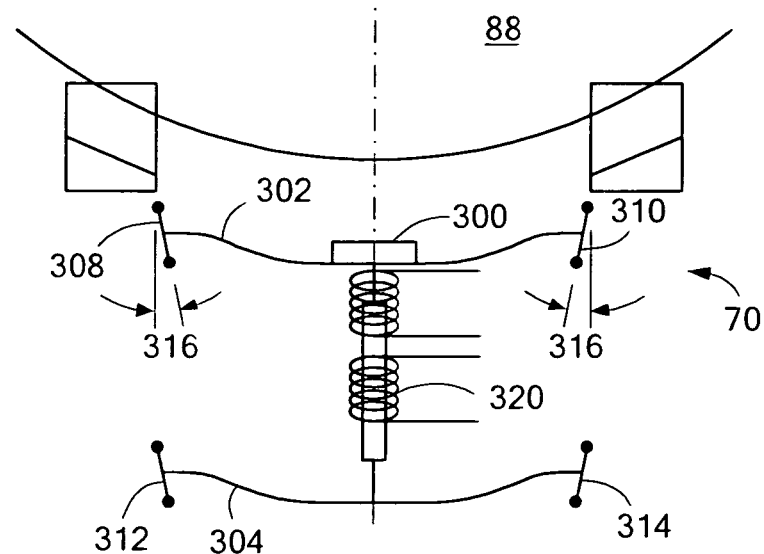
FIG. 18 is a schematic top-view showing another embodiment of the active gripper mechanism shown in FIG. 2 in the load/release position.
Figure 19:
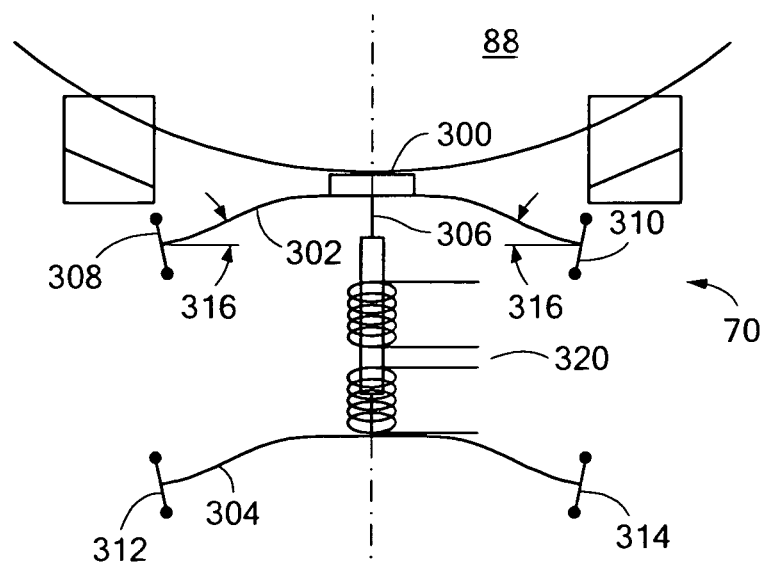
FIG. 19 is a schematic top-view showing another embodiment of the active gripper mechanism shown in FIG. 2 in the substrate gripping position.
Figure 20:
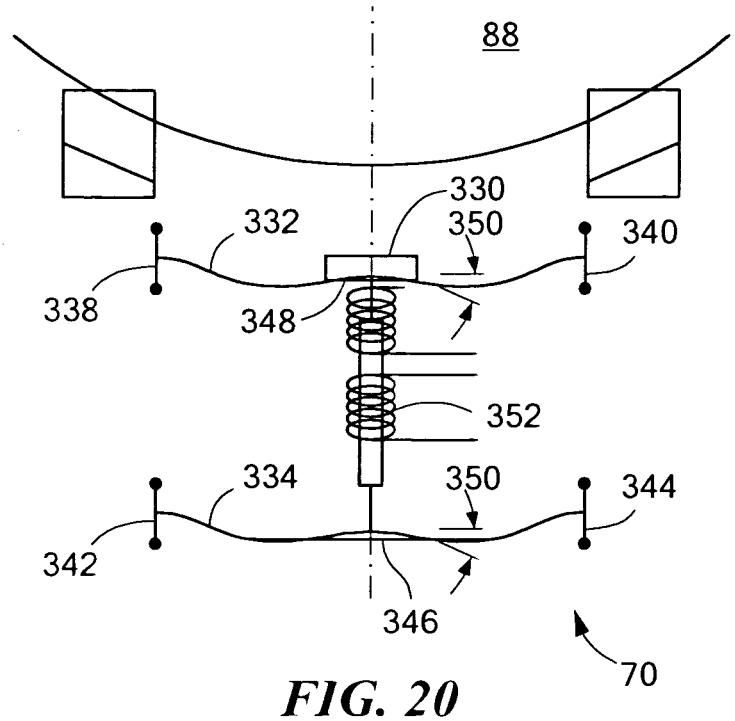
FIG. 20 is a schematic top-view showing another embodiment of the active gripper mechanism shown in FIG. 2 in the load/release position.
Figure 21:
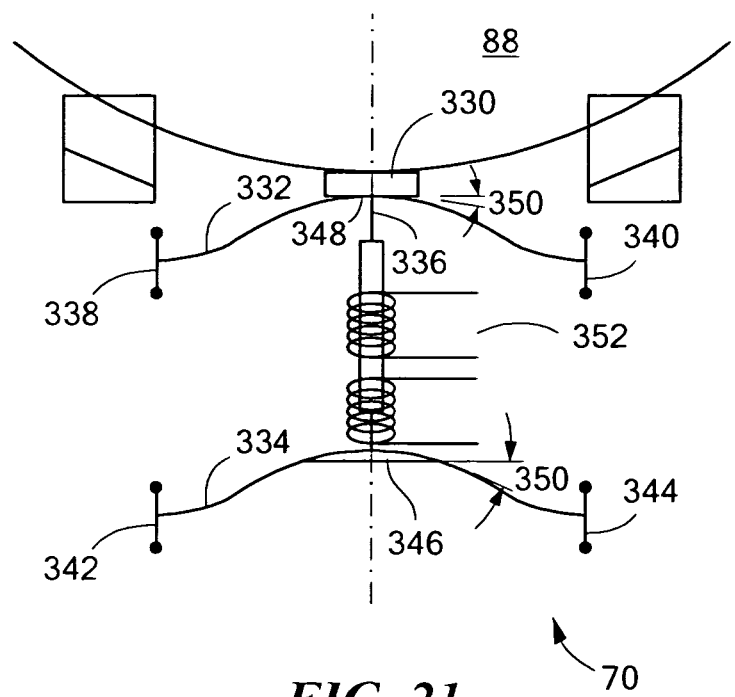
FIG. 21 is a schematic top-view showing another embodiment of the active gripper mechanism shown in FIG. 2 in the substrate gripping position.

As shown in FIGS. 18-21, a flexure or bias device arrangement with an asymmetric force profile may be provided. As shown in FIGS. 18 and 19, contact element 300 may be coupled to a bias device, e.g., system of flexures 302 and 304, which may be connected through rod 306 and coupled to robot end-effector 70 rigidly at their ends or alternately via flexures 308, 310, 312, 314 respectively as shown. Each of the rigid connections or flexures is angled 316 to bias the force profile of flexures in an asymmetric manner and as will be described with respect to FIG. 22. Here, the force profile is biased toward wafer 70 such that the force required for actuator 320 to transition from the unclamped state of FIG. 18 to the clamped state of FIG. 19 is less than the force required to transition from the clamped state of FIG. 19 to the unclamped state of FIG. 18. Further, when actuator 320 is not energized, the retaining force of the flexures cannot be overcome by inertial effects applied to the flexure assembly during motion when in either state shown in FIG. 18 or FIG. 19 where the clamping force applied to substrate 70 shown in FIG. 19 may be higher to overcome the combined inertial effects including the wafer. Here, flexures 302, 304 may be configured so that contact element 300 can move along a substantially straight line between the retracted substrate loading/release position, shown in FIG. 18, and the extended substrate gripping position, shown in FIG. 19, and provide an adequate passive force to keep contact element 300 in the retracted substrate loading/release position shown in FIG. 18 as well as to exert sufficient passive force to keep substrate 88 clamped against hard stop portions regardless of the effects of the acceleration of the robot arm. As shown in FIGS. 20 and 21, contact element 330 may be coupled to a bias device, e.g., system of flexures 332 and 334, which may be connected through rod 336 and coupled to robot end-effector 70 rigidly at their ends or alternately via flexures 338, 340, 342, 344 respectively as shown. Curved profile element 346 is provided with a curved surface 348 of contact element 330 to constrain flexures 334, 332 respectively angled 350 to bias the force profile of flexures in an asymmetric manner and as will be described with respect to FIG. 22. Here, the force profile is biased toward wafer 70 such that the force required for actuator 352 to transition from the unclamped state of FIG. 20 to the clamped state of FIG. 21 is less than the force required to transition from the clamped state of FIG. 21 to the unclamped state of FIG. 20. Further, when actuator 352 is not energized, the retaining force of the flexures cannot be overcome by inertial effects applied to the flexure assembly during motion when in either state shown in FIG. 20 or FIG. 21 where the clamping force applied to substrate 70 shown in FIG. 21 may be higher to overcome the combined inertial effects including the wafer. Here, flexures 332, 334 may be configured so that contact element 330 can move along a substantially straight line between the retracted substrate loading/release position, shown in FIG. 20, and the extended substrate gripping position, shown in FIG. 21, and provide an adequate passive force to keep contact element 330 in the retracted substrate loading/release position shown in FIG. 20 as well as to exert sufficient passive force to keep substrate 88 clamped as in FIG. 21 against hard stop portions regardless of the effects of the acceleration of the robot arm.

Figure 22:
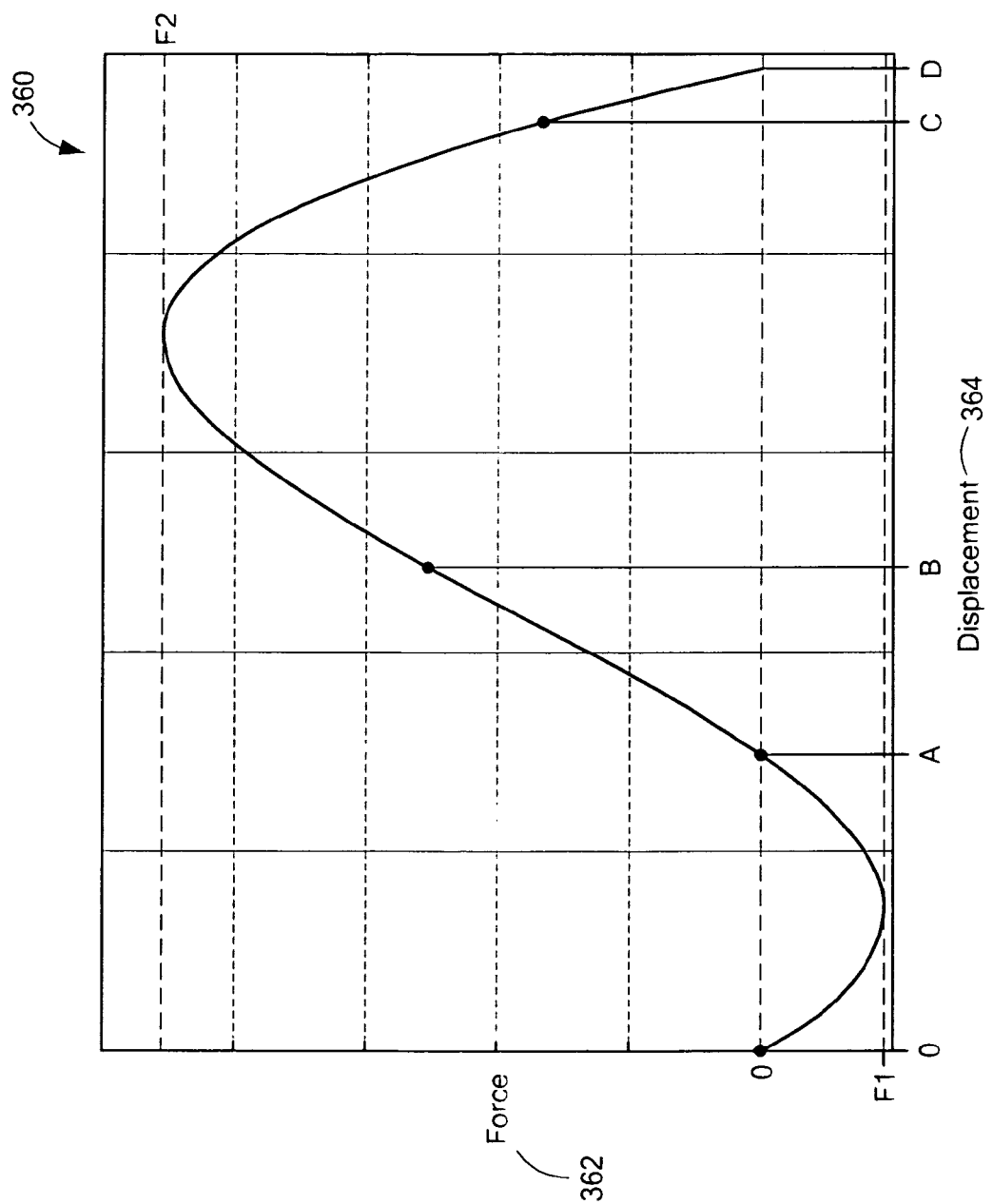
FIG. 22 is a plot depicting one example of the asymmetric force displacement profile of the active gripper mechanism shown in one or more of FIGS. 18-21.

Referring now to FIG. 22 a diagram showing the asymmetric force-displacement profile of a biasing element, for example as discussed with respect to the gripper flexure arrangement as shown in FIGS. 18-21. Here, graph 360 in FIG. 22 shows force 362 exerted by the flexure in the direction of extension of the gripper as a function of the displacement 364 of the flexure, which also measures in the direction of extension of the gripper. The displacement is zero when the gripper is open or retracted, for example, as shown in FIG. 18. The displacement that corresponds to the neutral point of the flexure zero force is denoted as A. Point B indicates the smallest displacement at which the gripper may contact a wafer. The displacement that corresponds to a properly gripped wafer is denoted as C, for example as shown in FIG. 19. The maximum displacement, represented by point D in the figure, corresponds to the position when the gripper is fully extended, for example without wafer 88 present. The flexure may be designed so that the force-displacement profile is asymmetric, e.g., as shown in FIG. 22. The area defined by the force-displacement profile between points 0 and A represents the work that needs to be produced by the actuator in order to overcome the neutral point as it extends the gripper from the retracted position. This area may be as small as possible in order to minimize heat dissipation. The magnitude of force F1 needs to be large enough to keep the gripper safely open in the presence of inertial forces induced by the motion of the robot. At point B, which is the smallest displacement at which the gripper may contact a wafer, the flexure needs to provide enough force so that the sum of the force produced by the actuator and the force provided by the flexure facilitates and produces desired motion of the wafer toward the tips of the end-effector. At point C, i.e., the displacement that corresponds to a wafer properly gripped and pushed against the tips of the end-effector, the flexure needs to produce enough force to keep the wafer in place in the presence of inertial forces induced by the motion of the robot. The maximum force of the flexure, F2, may be smaller than the magnitude of the force produced by the actuator when the gripper is being open. The displacement of the gripper can be utilized to verify proper functionality of the gripper and/or wafer presence. When the gripper is commanded to be in its open state, the displacement should read between 0 and A. A malfunction occurred if the displacement exceeds this range. When the gripper is commanded to be closed, the displacement should be substantially equal to C. A malfunction occurred if the displacement is substantially smaller than C. No wafer is present or wafer is not properly gripped of the displacement substantially exceeds C.

Figure 8:
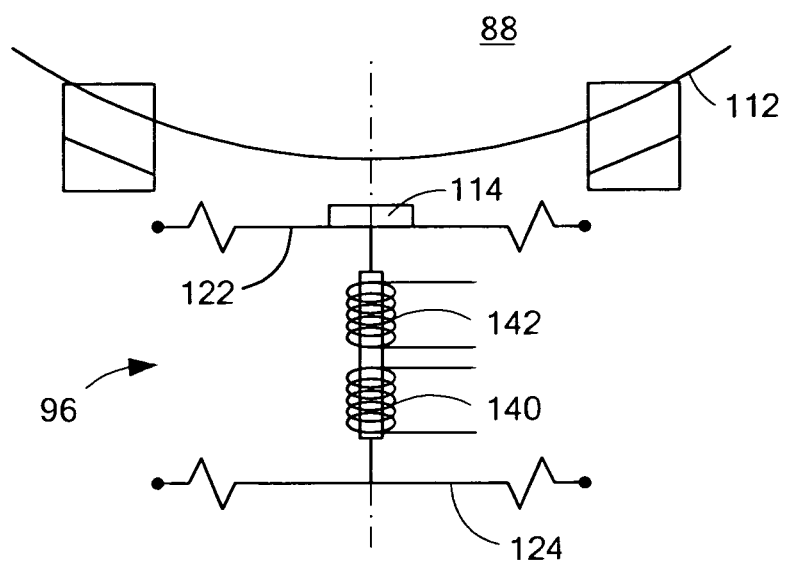
FIG. 8 is a schematic top-view of another embodiment of the active gripper mechanism shown in FIG. 2.
Figure 9:
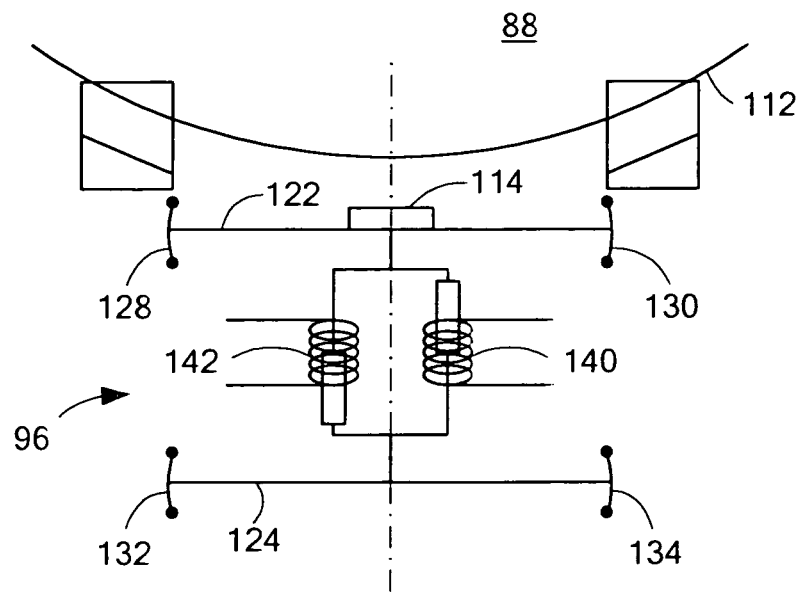
FIG. 9 is a schematic top-view of another embodiment of the active gripper mechanism shown in FIG. 2.
Figure 10:
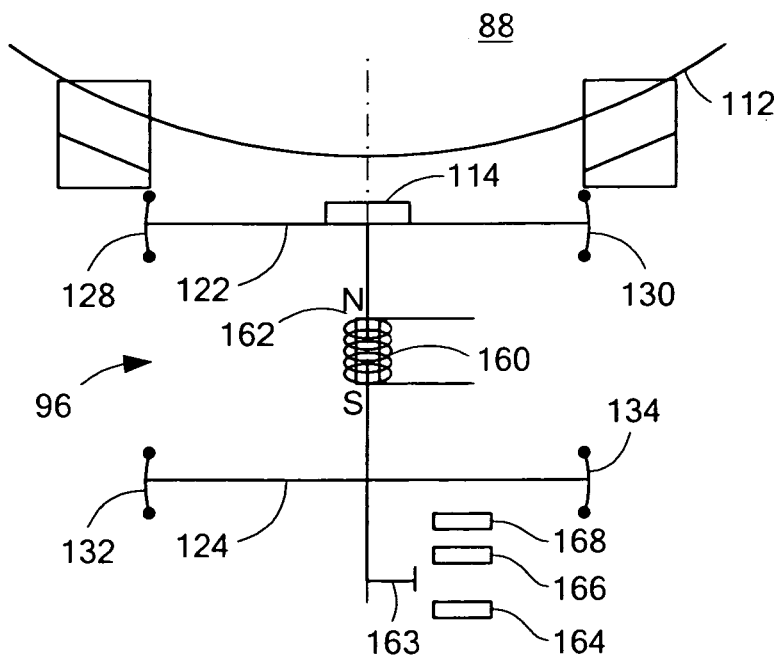
FIG. 10 is a schematic top-view of another embodiment of the active gripper mechanism shown in FIG. 2.

Referring to FIG. 2, the system of flexures 122, 124, 128, 130, 132, 134 may be simplified by incorporating additional features to flexures 122 and 124 and coupling flexures 122 and 124 directly to robot end-effector 70, as shown in FIG. 8. Solenoids 140 and 142, FIG. 2, may be arranged in a side-by-side manner, e.g., as shown in FIG. 9. Alternatively, single solenoid 160, FIG. 10, with permanent magnet 162 may be utilized and the direction of the force produced by solenoid 160 may be controlled by the polarity of the voltage applied to solenoid 162, e.g., as shown in FIG. 10. In this example, the windings of solenoid or actuator 160 may be designed to limit the speed effectively damping motion of contact element 114. For example, the windings may be designed with a high back emf constant such that the back emf voltage reaches or exceeds the driving voltage during motion. Additional position sensors may be provided, optical, inductive or otherwise. For example, flag 163 may be provided to detect the position of contact element 114. Here, over travel sensor 168 may detect if contact element 114 has over travelled during a grip. Gripped sensor 166 may detect if contact element 114 has gripped the substrate. Un-gripped sensor 164 may detect if contact element 114 has un-gripped the substrate.

Figure 11A:
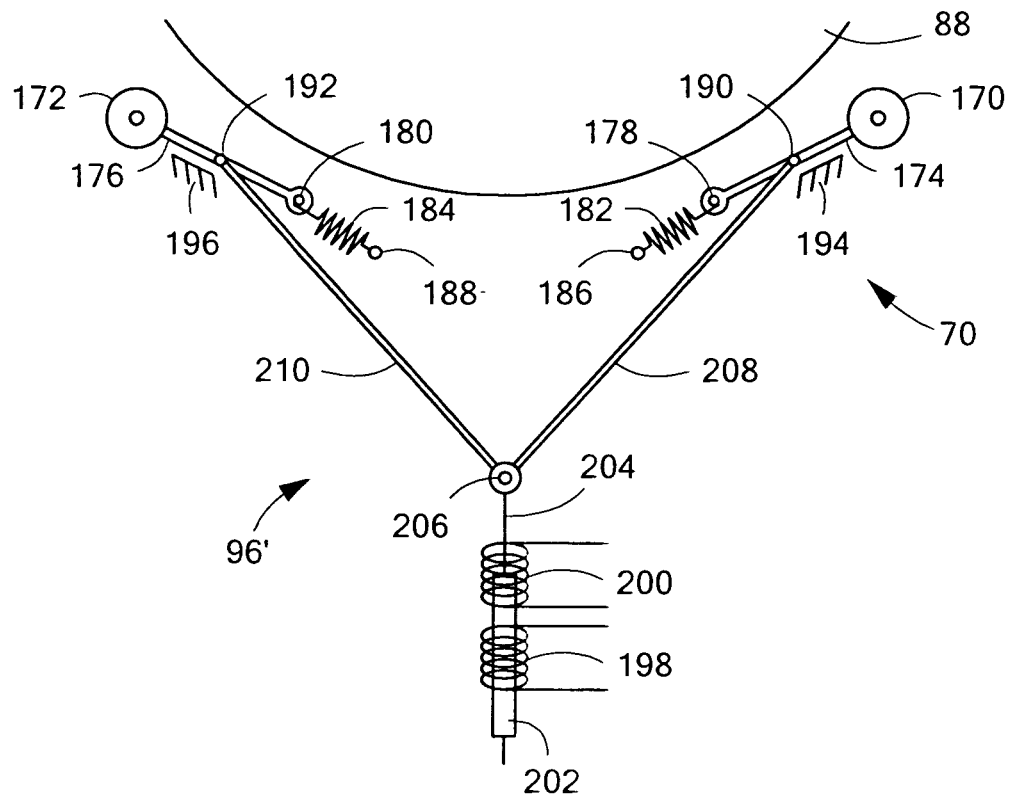
FIG. 11A is a schematic top-view of another embodiment of the active gripper mechanism shown in FIG. 2.

In an alternate embodiment, gripper mechanism 96', FIG. 11A includes contact rollers 170, 172 coupled to links 174, 176 with links 174, 176 pivotally coupled to end-effector 70 (also shown in FIG. 1) at joints 178, 180. Bias devices 182, 184, e.g., springs or similar type devices, pivotally coupled to end-effector 70 at joints 186, 188 and to links 174, 176 at joints 190, 192 such that when the line of force of bias devices 182, 184 lies below joints 178, 180, a moment is created such that links 174, 176 are biased against stops 194, 196 of end-effector 70. Solenoids 198 and 200 may be utilized to exert force on iron core 202 coupled to rod 204 to move contact elements 170, 172 between the retracted substrate loading/release position as shown in FIG. 11A and the extended substrate gripping position. Here, rod 204 has joint 206 coupled to links 208, 210 where links 208, 210 are coupled to links 174, 176 at joints 190, 192. In particular, solenoid 200 may be energized to move contact elements 170, 172 from the retracted substrate loading/release position shown in FIG. 11A to the extended substrate gripping position where roller contact elements 170, 172 contact the edge of substrate 88. Here, when the line of force of bias devices 182, 184 lies above joints 178, 180, a moment is created such that links 174, 176 are biased against the edge of substrate 88. Similarly, solenoid 198 may be energized to move contact elements 170, 172 from the extended substrate gripping position to the retracted substrate loading/release position shown in FIG. 11A. When the desired state of the gripper system has been achieved, power may be removed from solenoids 198, 200, and the robot gripper system may be maintained in the open state (contact element retracted in substrate loading/release position) or close state (contact element extended in substrate gripping position) solely by the passive forces produced by springs 182, 184. In the embodiment shown, two contact elements 170, 172 are provided movably coupled to the end-effector 70 moveable from a substrate engaging grip position to a release position as shown in FIG. 11A. Here, bias devices 184, 188 are coupled to the contact elements 170, 172 with solenoid or actuator 198, 200, 202 coupled to the end-effector 70 and configured to move the contact elements 170, 172. In this example, the bias devices 182, 184 are configured to passively bias the contact elements in the grip position such that the contact elements contact an edge of the substrate 88 urging the substrate against one or more hard stops with the bias devices 182, 184 further configured to passively bias the contact elements 170, 172 in the release position as shown in FIG. 11A such that the contact elements 170, 172 are retained in the release position. Here, the solenoid or actuator 198, 200, 202 is pulsed when moving the contacting elements 170, 172 from the grip position to the release position and from the release position to the grip position. Here, actuating power may be removed from the solenoid or actuator 198, 200 after moving the contacting elements 170, 172 from the grip position to the release position and from the release position to the grip position. Although bias devices 182, 184 may be configured as springs and links with joints are shown, the bias devices may be configured as one or more flexures and may be employed instead of one or more of the springs, links and joints. Similarly, solenoid or actuator 198, 200, 202 may be configured as discussed above to measure a position of the contact elements 170, 172, for example, to measure or detect a gripped substrate state and trigger an error condition when the substrate is not properly gripped.

Figure 11B:
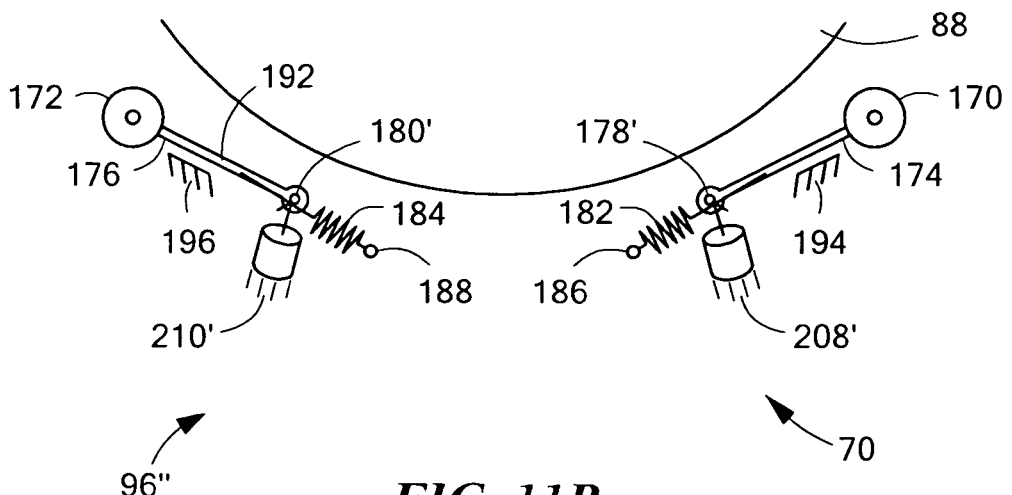
FIG. 11B is a schematic top-view of another embodiment of the active gripper mechanism shown in FIG. 2.

Referring also to FIG. 11B, there is shown an alternate gripper mechanism 96" having an alternate actuation incorporating features similar to FIG. 11A. Gripper 96" includes contact rollers 170, 172 coupled to links 174, 176 with links 174, 176 pivotally coupled to end-effector 70 at joints 178, 180 by rotary solenoids 208', 210' respectively. Here, rotary solenoids 208', 210' may be grounded to end-effector 70 such that when actuated rotary solenoids 208', 210' selectively rotate links 174, 176 to engage or disengage the edge of substrate 88. In alternate aspects, any suitable rotary actuator may be provided. Similarly, bias devices 182, 184, e.g., springs or similar type devices, pivotally coupled to end-effector 70 at joints 186, 188 and to links 174, 176 at joints 190, 192 such that when the line of force of bias devices 182, 184 lies below joints 178, 180, a moment is created such that links 174, 176 are biased against stops 194, 196 of end-effector 70. Here, rotary solenoids 208', 210' may be utilized to move contact elements 170, 172 between the retracted substrate loading/release position as shown in FIG. 11B and the extended substrate gripping position. When the desired state of the gripper system has been achieved, power may be removed from rotary solenoids 208', 210' and the robot gripper system may be maintained in the open state (contact element retracted in substrate loading/release position) or close state (contact element extended in substrate gripping position) solely by the passive forces produced by springs 182, 184. In the embodiment shown, two contact elements 170, 172 are provided movably coupled to the end-effector 70 moveable from a substrate engaging grip position to a release position as shown in FIG. 11. Here, bias devices 184, 188 are coupled to the contact elements 170, 172 with solenoid or actuator 198, 200, 202 coupled to the end-effector 70 and configured to move the contact elements 170, 172. In this example, the bias devices 182, 184 are configured to passively bias the contact elements in the grip position such that the contact elements contact an edge of the substrate 88 urging the substrate against one or more hard stops with the bias devices 182, 184 further configured to passively bias the contact elements 170, 172 in the release position as shown in FIG. 11B such that the contact elements 170, 172 are retained in the release position. Here, the solenoid or actuator 208', 210' is pulsed when moving the contacting elements 170, 172 from the grip position to the release position and from the release position to the grip position. Here, actuating power may be removed from the solenoid or actuator 198, 200 after moving the contacting elements 170, 172 from the grip position to the release position and from the release position to the grip position. Although bias devices 182, 184 may be configured as springs and links with joints are shown, the bias devices may be configured as one or more flexures and may be employed instead of one or more of the springs, links and joints. Similarly, solenoid or actuator 208', 210' may be configured as discussed above to measure a position of the contact elements 170, 172, for example, to measure or detect a gripped substrate state and trigger an error condition when the substrate is not properly gripped.

Figure 12:
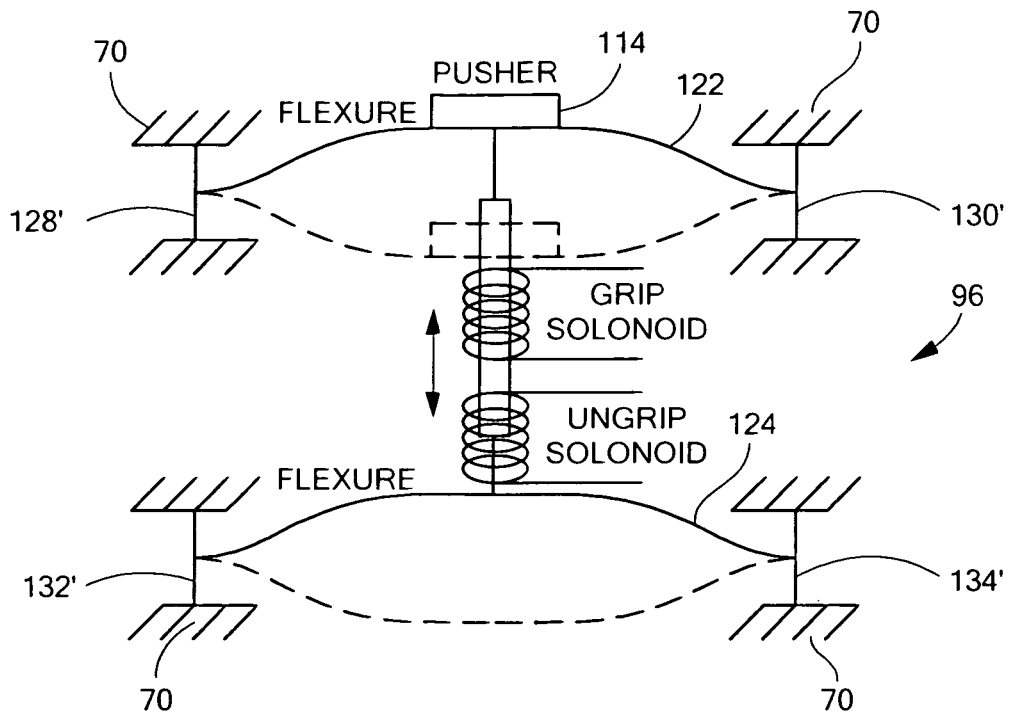
FIG. 12 is a schematic top-view of another embodiment of the active gripper mechanism shown in FIG. 2.

In one example, active gripper mechanism 96, FIG. 12, may include alternately mounted flexures 128', 130', 132' and 134'. Flexures 128', 130', 132' and 134' may have similar function as flexures 128, 130, 132 and 134, discussed above with respect to one or more of FIGS. 2-10. However, instead of being pivotally connected to end-effector 70, flexures 128', 130', 132' and 134' are shown grounded with respect to end-effector 70. Here, flexures 128', 130', 132' and 134' may act in a more rigid fashion when compared to flexures 128, 130, 132 and 134, FIG. 2. In alternate aspects, any suitable mounting may be provided.

Figure 13:
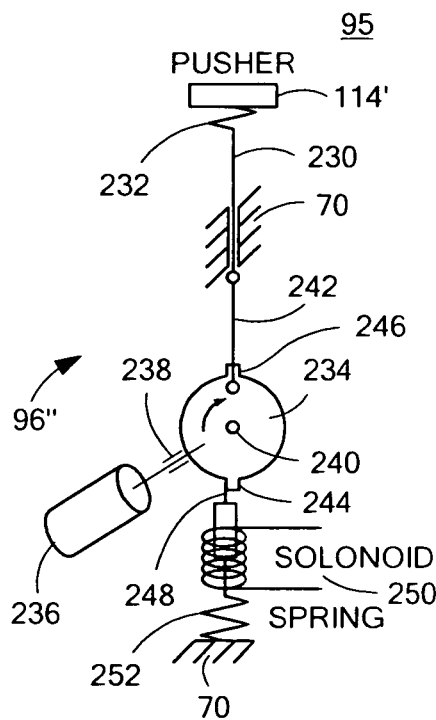
FIG. 13 is a schematic top-view of another embodiment of the active gripper mechanism shown in FIG. 2.
Figure 14:
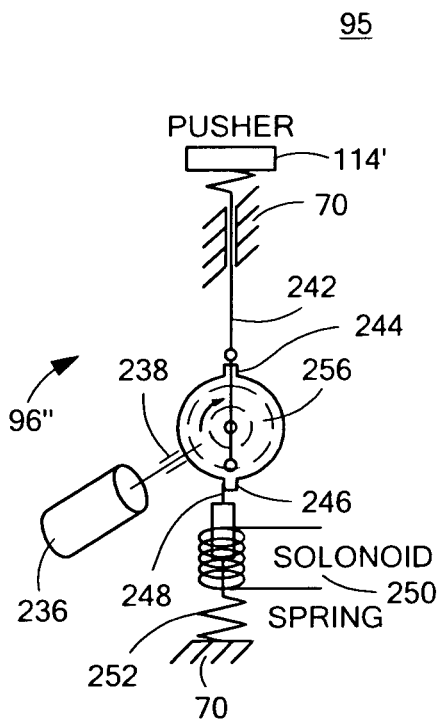
FIG. 14 is a schematic top-view of another embodiment of the active gripper mechanism shown in FIG. 2.

As another alternative to solenoids 140 and 142, FIG. 2, active gripper mechanism 96", FIGS. 13-14, may be actuated by energy harvested from the motion of the robot arm. For example, one or more inertial elements coupled to a ratcheting mechanism may be utilized to wind a torsional spring which may store energy for actuation of the robot gripper system as will be discussed below with respect to FIGS. 13, 14, 16, and 17. Similarly, a ratcheting mechanism may be employed to wind the torsional spring using relative motion of end-effector 70 with respect to the robot arm as will be discussed below. The energy stored in the torsional spring may be released by pulsing a solenoid. The embodiments described below provide an exemplary gripper where mechanical energy is stored and released from the motion or inertial effects of the robot and/or interaction with components having relative motion. In alternate aspects, any suitable combination of energy generation, storage and release may be provided. For example, energy generation may be provided driven from relative motion of robotics joints or from inertial interaction or otherwise, e.g., by relative motion at a wrist, driven by an unbalanced mass, electromagnetically such as with a dynamo, piezoelectrically, by unbalanced inertial mass or otherwise. Energy storage may be by any suitable storage medium, mechanically, electrically or otherwise. For example, storage may be by means of a working fluid, a torsion or other spring in conjunction with a spring clutch, roller or toothed ratchet, unidirectional or bidirectional storage, a battery or capacitor or otherwise. Energy release may be by any suitable mechanical or electrical method or combinations thereof. For example, energy release may be by a solenoid released rotary mass, by rotary to linear conversion, triggered or actuated mechanically such as slaved off of a z-axis move or by contact with a substrate or other suitable mechanical method, by incremental or stepped moves or otherwise. Accordingly, all such alternatives are embraced.

Active gripper system 96", FIGS. 13-14, is coupled to end-effector 70 which may be conveniently actuated by energy generated local to the robot wrist and stored, for example, in torsional spring 236 as shown. Gripper system 96" includes pusher or contact member 114' which may function similar to that of contact member 114, shown in one or more of FIGS. 2-12, or otherwise. FIG. 13 shows an example of gripper mechanism 96" in a gripped state and FIG. 14 shows gripper 96" in an un-gripped state. Gripper system 96" includes contact member 114' coupled to linear driven member 230 with spring 232. Rotating member 234 is rotatably coupled to end-effector 70 and is coupled to energy storage device, e.g., torsion spring 236 via slip clutch 238. Slip clutch 238 may be set to slip to prevent excessive wind up of torsion spring 236. Rotating member 234 rotates about pivot 240 and is coupled to driven member 230 with link 242, where member 234 acts as a crank while driven member 230 acts as a slider forming a slider crank mechanism. In alternate aspects, any suitable mechanism, such as cammed or otherwise may be used. Rotating member 234 has opposing fingers 244, 246 that engage solenoid member 248. When release solenoid member 248 is retracted or withdrawn by pulsing solenoid 250, stored energy in torsion spring 236 is released causing rotating member 234 to rotate, for example from the position shown in FIG. 13 to the position shown in FIG. 14. Here, solenoid 250 may be as described and having a return spring 252 such that after pulsing solenoid 250, spring 252 returns solenoid member 248 to the same position for another cycle. Sequentially pulsing solenoid 250 sequentially grips and un-grips the substrate. Winding 256 may be provided within end-effector 70 and/or rotating member 234 to dampen and control rotation of member 234. Alternately any suitable storage and release device(s) may be provided.

Figure 17:
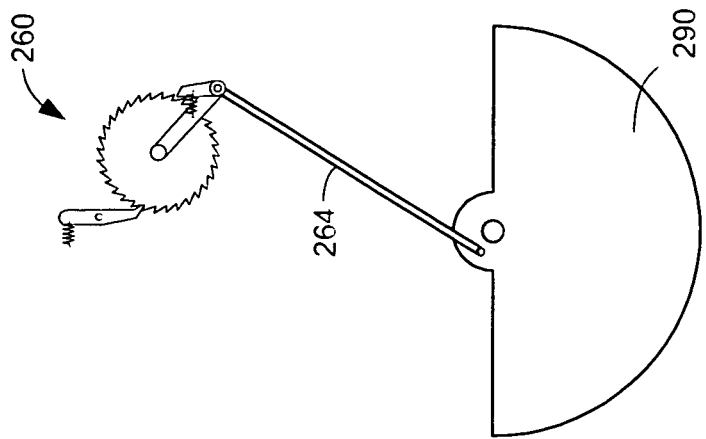
FIG. 17 is a schematic side-view of another example of a device used to wind the torsional spring shown in FIGS. 13 and 14.
Figure 16:
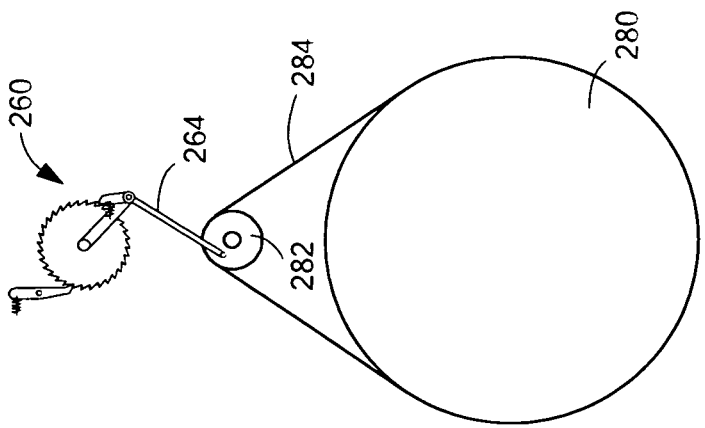
FIG. 16 is a schematic side-view showing another example of a device used to wind the torsional spring shown in FIG. 14.
Figure 15:
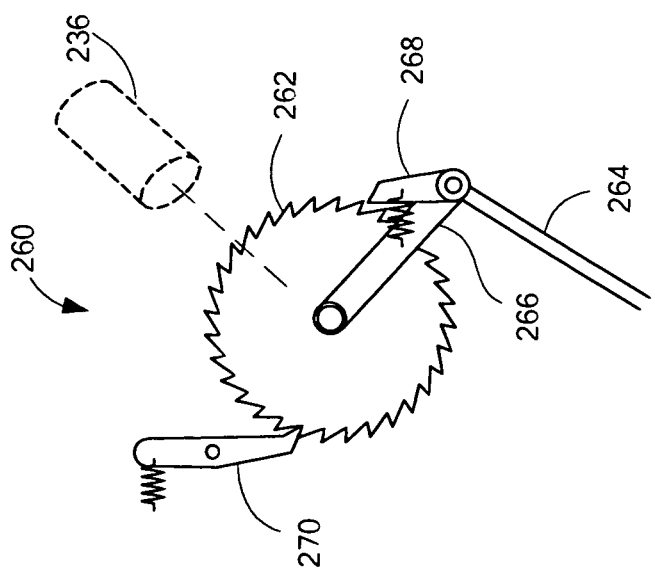
FIG. 15 is a schematic side-view showing one example of a device used to wind the torsional spring shown in FIG. 14.

FIG. 15 shows an exemplary toothed ratchet mechanism 260 which may be used to wind torsional spring 236. Here, ratchet mechanism 260 has toothed ratchet 262 coupled to and driving torsion spring 236. Reciprocating link 264 is coupled to arm 266 and spring loaded catch 268. Spring loaded pawl 270 prevents back driving of toothed ratchet 262. Reciprocating motion of link 264 progressively rotates ratchet wheel 262 in the same direction preloading torsion spring 236. In another example, energy generation may be by relative motion of the forearm relative to the end-effector, e.g., as shown in FIG. 16. In this example, driver pulley 280 may be grounded to the forearm at the wrist with ratchet 260 and driven pulley 282 grounded relative to the end-effector. Here, with relative rotation, driver pulley 280 rotates driven pulley 282 via belt 284 causing link 264 to reciprocate and drive ratchet wheel 262. Similarly, as shown in FIG. 17, eccentric mass or inertia 290 may be rotatably grounded with respect to the end-effector where motion of the arm causes eccentric mass to rotate or reciprocate with eccentric mass 290 coupled to link 264 causing link 264 to reciprocate and drive ratchet wheel 262. Alternately any suitable storage and release device(s) may be provided.

The robot gripper systems discussed above may in some embodiments not include any conventional linear or rotary couplings, such as bearings, that would represent a cleanliness or out-gassing risk, and may not consume any energy when kept in an open or closed state, thus minimizing the amount of heat generated by the robot gripper system. Therefore, the robot gripper system according to the disclosed embodiment is suitable for contamination-sensitive applications in vacuum environments.

Although specific features of the disclosed embodiment are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A vacuum robot adapted to grip and transport a substrate, the robot comprising:
   a robot drive coupled to an arm and having an end-effector adapted to support the substrate;
   a robot gripper system coupled to the end-effector including:
      a front support having at least one hard stop,
      a movable contact element,
      a movable bias device coupled to the contact element, and
      at least one powered actuator coupled to the end-effector including a driven member actuating the bias device and configured to move the contact element between a release position and a grip position; and
      wherein the bias device is configured to passively bias the contact element in the grip position such that the contact element contacts an edge of the substrate to urge the substrate against the at least one hard stop to secure the substrate in the grip position when the powered actuator is not powered and configured to passively bias the contact element in the release position when the powered actuator is not powered such that the contact element is retained in the release position.

2. The system of claim 1 in which the gripper system is configured to stop delivering power to the at least one actuator when the contact element is in the grip position.

3. The system of claim 1 in which the gripper system is configured to stop delivering power to the at least one actuator when the contact element is in the release position.

4. The system of claim 1 in which the at least one actuator is configured to measure the position of the contact element to determine a gripped substrate state.

5. The system of claim 4 in which the gripper system is configured to maintain the substrate in the gripped substrate state when the arm accelerates or decelerates.

6. The system of claim 1 in which the at least on actuator includes one or more solenoids.

7. The system of claim 1 in which the at least one actuator is configured to control the speed in which the contact element moves from the release position to the grip position and from the grip position to the release position.

8. The system of claim 1 in which the bias device includes one or more springs and/or one or more flexures.

9. The system of claim 8 in which the one or more flexures are configured in an angled arrangement to asymmetrically bias the force profile of said flexures.

10. The system of claim 9 in which the one or more flexures include a flexure having a curved profile.

11. The system of claim 1 in which the gripper system is configured to harvest motion from the articulated arm and includes a torsional spring configured to store harvested motion.

12. A robot adapted to transport a substrate, the robot comprising:
   a robot drive coupled to an arm and having an end-effector adapted to support the substrate;
   a front support having at least one hard stop coupled to the end-effector;
   a contact element movably coupled to the end-effector;
   a movable bias device coupled to the contact element; and
   at least one powered actuator coupled to the end-effector including a driven member actuating the bias device and configured to move the contact element between a grip position and a release position;
   wherein the bias device is configured to passively bias the contact element in the grip position when the powered actuator is not powered such that the contact element contacts an edge of the substrate urging the substrate against the at least one hard stop and configured to passively bias the contact element in the release position when the powered actuator is not powered such that the contact element is retained in the release position.

13. A method for a robot to transport a substrate, the method comprising:
   providing a robot drive coupled to an arm and having an end-effector adapted to support the substrate;
   providing a front support having at least one hard stop coupled to the end-effector;
   using a powered actuator coupled to the end effector to move a contact element between a grip position and a release position using a driven member actuating the contact member;
   passively biasing the contact element in the grip position such that the contact element contacts an edge of the substrate to urge the substrate against the at least one hard stop; and
   passively biasing the contact element in the release position such that the contact element is retained in the release position.

14. The method of claim 13 further including stopping delivery of power to the at least one actuator when the contact element is in the grip position.

15. The method of claim 13 further including stopping delivery of power to the at least one actuator when the contact element is in the release position.

16. The method of claim 13 further including measuring the position of the contact element to determine a gripped substrate state.

17. The method of claim 13 further including controlling the speed in which the contact element moves from the release position to the grip position and from the grip position to the release position.

18. The method of claim 13 further including harvesting motion from the arm.

19. The method of claim 18 further including storing the harvested motion.

20. The method of claim 13 further including maintaining the substrate in the gripped state when the arm accelerates or decelerates.

* * * * *